United States Patent
Ichikawa et al.

(10) Patent No.: US 7,276,427 B2
(45) Date of Patent: Oct. 2, 2007

(54) METHOD FOR MANUFACTURING SOI WAFER

(75) Inventors: Masashi Ichikawa, Fukushima (JP); Takeshi Kobayashi, Fukushima (JP); Miho Iwabuchi, Fukushima (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 132 days.

(21) Appl. No.: 10/537,092

(22) PCT Filed: Dec. 1, 2003

(86) PCT No.: PCT/JP03/15326

§ 371 (c)(1),
(2), (4) Date: Jun. 2, 2005

(87) PCT Pub. No.: WO2004/055871

PCT Pub. Date: Jul. 1, 2004

(65) Prior Publication Data

US 2006/0014330 A1    Jan. 19, 2006

(30) Foreign Application Priority Data

Dec. 13, 2002    (JP)    ............................. 2002-362937

(51) Int. Cl.
*H01L 21/30*    (2006.01)
(52) U.S. Cl. ............................. 438/455; 257/E21.122
(58) Field of Classification Search .................. 438/14, 438/455; 257/E21.122

See application file for complete search history.

(56) References Cited

U.S. PATENT DOCUMENTS

2002/0155630 A1    10/2002    Iwabuchi
2003/0020096 A1    1/2003    Akiyama et al.

FOREIGN PATENT DOCUMENTS

EP    1 137 069 A1    9/2001

(Continued)

OTHER PUBLICATIONS

PCT International Search Report for PCT/JP03/15326 mailed on Mar. 2, 2004.

*Primary Examiner*—Scott B. Geyer
*Assistant Examiner*—Elias Ullah
(74) *Attorney, Agent, or Firm*—Rader, Fishman & Grauer PLLC (57) ABSTRACT

The present invention provides a manufacturing method for an SOI wafer with a high productivity in which generation of a void is suppressed in manufacturing the SOI wafer. In a manufacturing method for an SOI wafer of the present invention in which two starting wafers are prepared, an insulating layer is formed on at least one of the two starting wafers and the one wafer is adhered to the other wafer without using an adhesive agent, the starting wafers each with no line defect on a surface thereof are used. In a manufacturing method for an SOI wafer of the present invention in which two starting wafers are prepared, an insulating layer is formed on at least one of the two starting wafers and the one wafer is adhered to the other wafer without using an adhesive agent, the starting wafers are subjected to a high temperature heat treatment in advance.

4 Claims, 6 Drawing Sheets

FOREIGN PATENT DOCUMENTS

| | | |
|---|---|---|
| EP | 1 235 268 A1 | 8/2002 |
| JP | 05-211128 A1 | 8/1993 |
| JP | 08-264740 A1 | 10/1996 |
| JP | 09-232197 A1 | 9/1997 |
| JP | 10-084101 A1 | 3/1998 |
| JP | 2001-144275 A1 | 5/2001 |
| JP | 2002-076082 A1 | 3/2002 |
| WO | WO-01/17024 A1 | 3/2001 |
| WO | WO-02/19414 A1 | 3/2002 |

METHOD FOR MANUFACTURING SOI WAFER

TECHNICAL FIELD

The present invention relates to a method for manufacturing an SOI (Silicon on Insulator) wafer constituted of an SOI layer, an insulating layer and a support substrate, and particularly, to a method for manufacturing an SOI wafer by means of a bonding method (an adhering method).

BACKGROUND ART

In recent years, an integration level in an integrated circuit has greatly increased, which has been accompanied by stricter required conditions imposed on a manufacturing precision such as flatness or smoothness of a mirror-polished wafer surface. In addition, in order to achieve an integrated circuit higher in performance, reliability and product yield, not only a higher mechanical precision, but also better electric characteristics have been required. Especially, an SOI wafer, which is an ideal dielectric isolation substrate, has been used in applications to high frequency and high-speed devices mainly related to mobile communication equipment and medical equipment and further great increase in demand therefor is expected in the future.

Figure 6:
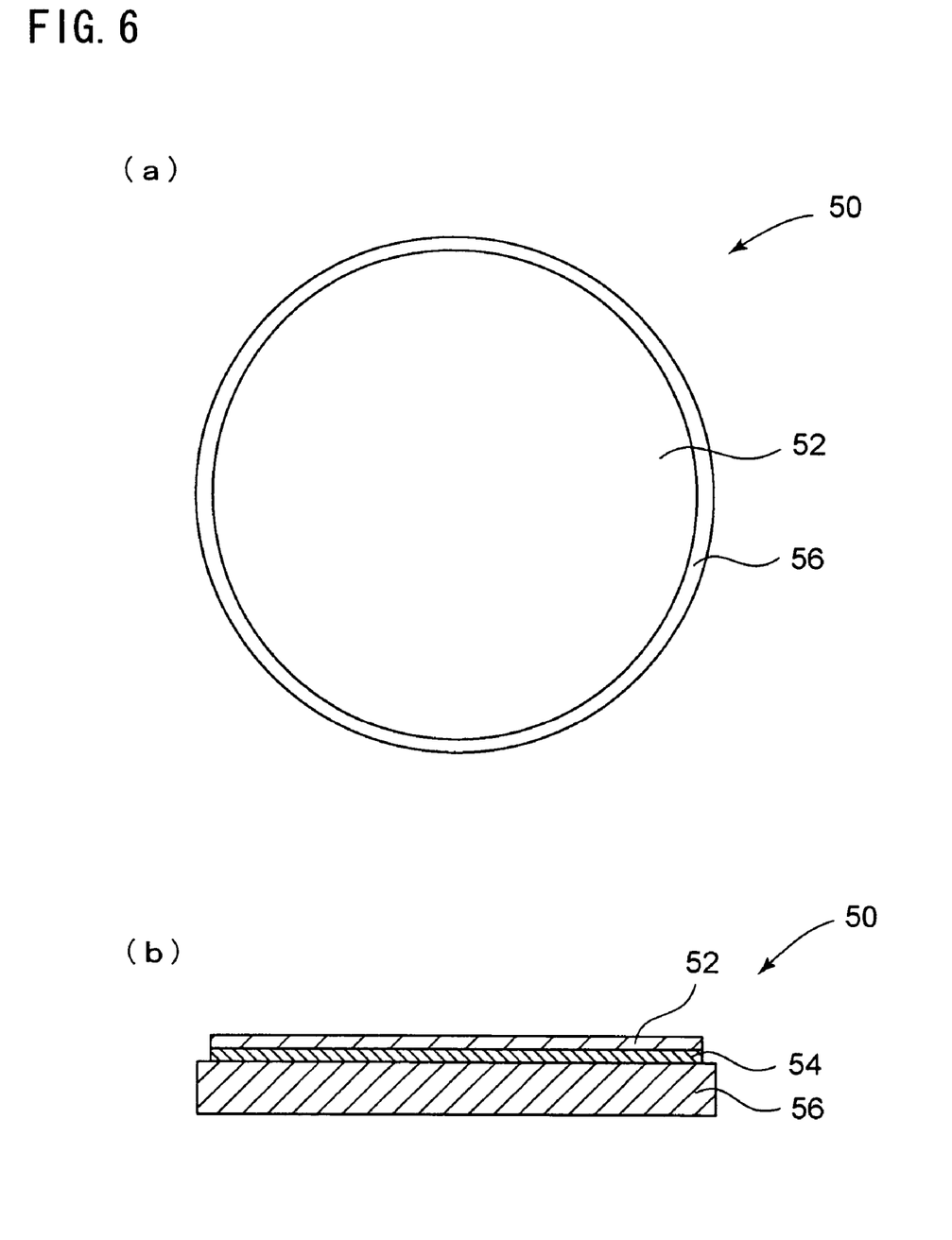
FIG. 6, consisting of FIGS. 6(a) and 6(b), is an explanatory view showing an example of manufacture of an SOI wafer, wherein the part (a) is an explanatory plan view and the part (b) is an explanatory sectional view.

An SOI wafer 50, as shown in FIG. 6, has a structure in which an SOI layer 52 (also referred to as a semiconductor layer or an active layer) for forming an element such as a single crystal silicon layer is formed on an insulating layer 54 (also referred to as a buried oxide (BOX) film layer or simply an oxide film layer) such as a silicon oxide film. The insulating layer 54 is formed on a support substrate 56 (also referred to as a substrate layer) and the SOI wafer 50 has a structure in which the insulating layer 54 and the SOI layer 52 are sequentially formed on the support substrate 56.

As conventional manufacturing methods for an SOI wafer 50 having the SOI structure in which the SOI layer 52 and the support substrate 56 are made of, for example, silicon and the insulating layer 54 is made of, for example, a silicon oxide film, there are exemplified an SIMOX (Separation by Implanted Oxygen) method in which oxygen ions are implanted into a silicon single crystal at a high concentration and thereafter the single crystal is subjected to heat treatment at a high temperature to form an oxide film thereon; and a bonding method (an adhering method) in which two mirror-polished wafers are bonded with each other with an oxide film interposed therebetween without the use of an adhesive, followed by processing one of the bonded wafers into a thin film.

Since the SIMOX method can controllably determine a film thickness of an active layer portion (an SOI layer) 52 to serve as a device active region by an acceleration voltage in oxygen ion implantation, there is an advantage that a thin active layer high in film thickness uniformity can be easily obtained, whereas there have remained many issues of reliability of a buried oxide film (an insulating layer) 54, crystallinity in an active layer 52, and others.

On the other hand, a wafer bonding method is carried out in such a way that an oxide film (insulating layer) 54 is formed on at least one of two single crystal silicon mirror-polished wafers, then both wafers are adhered with each other without using an adhesive, then the adhered wafers are subjected to heat treatment (usually at a temperature in the range of 1100° C. to 1200° C.) to strengthen bonding therebetween and thereafter one of the wafers is thinned into a thin film by grinding or wet etching, followed by mirror-polishing the surface of the thin film so as to obtain an SOI layer 52; which leads to advantages that reliability of the buried oxide film (an insulating layer) 54 is high and crystallinity of the SOI layer is also good. However, the thus adhered SOI wafer 50 is subjected to mechanical processing such as grinding or polishing into a thin film, and hence the obtained SOI layer 52 have limitations in its film thickness and uniformity.

Figure 7:
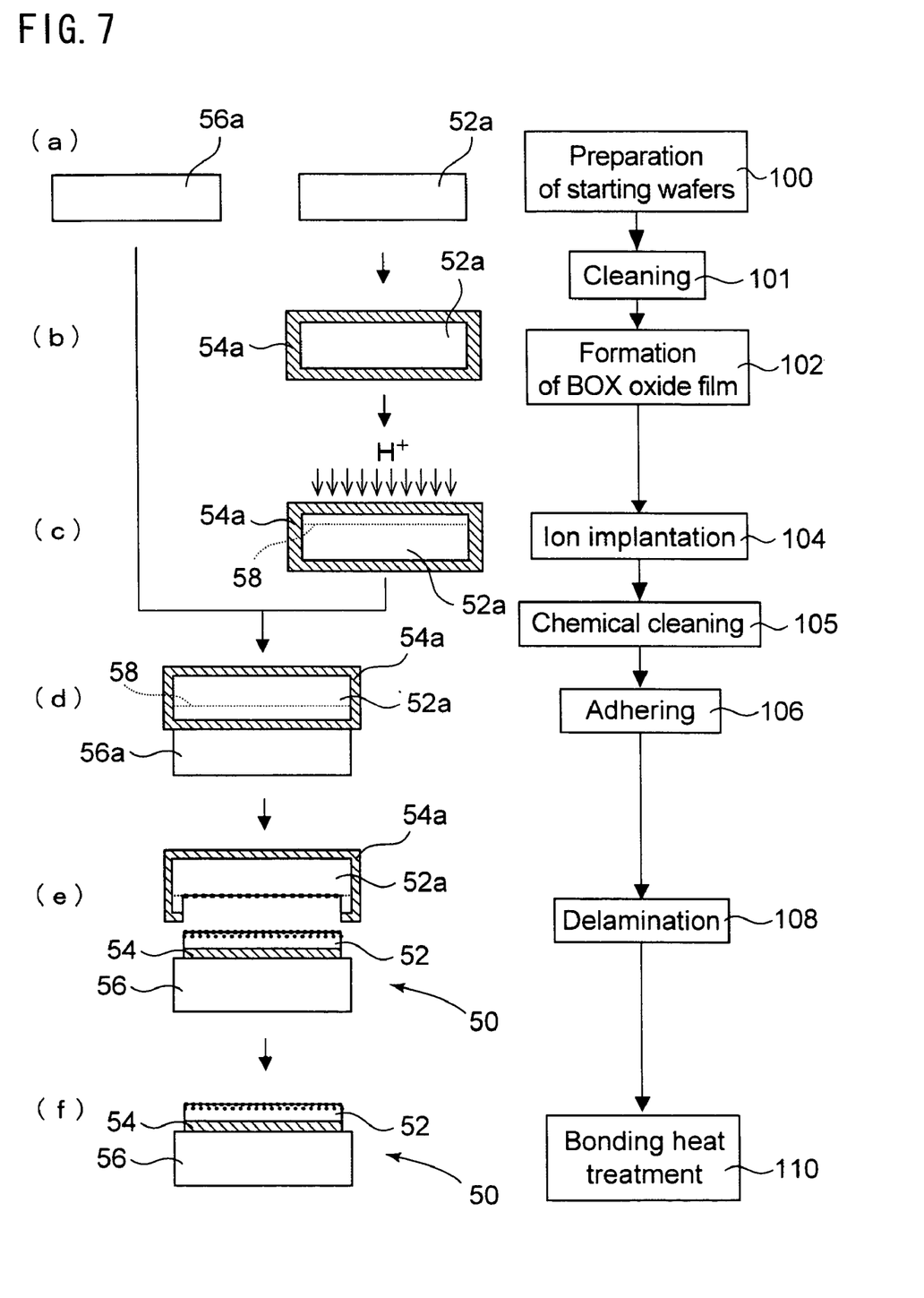
FIG. 7, consisting of FIGS. 7(a) to 7(f), is a flowchart showing an example of an order of steps in a conventional general method for manufacturing an SOI wafer together with schematic views.

As a method for manufacturing an SOI wafer, it has very recently started to pay attention to a method for manufacturing an SOI wafer by bonding an ion implanted wafer to another wafer and delaminating the wafer therefrom. This method is also referred to as an ion implantation delamination method, which is such a technique that as shown in FIG. 7, two silicon wafers are prepared; an oxide film (an insulating layer) is formed on at least one silicon wafer; hydrogen ions or rare gas ions are implanted onto an upper surface of the one silicon wafer; a micro-bubble layer (an enclosed layer) is formed in the interior of the one wafer, the surface onto which the ions are implanted is contacted and adhered with the other silicon wafer through the oxide film interposed therebetween; thereafter by applying heat treatment to the adhered wafers, a part of the one wafer is separated with the micro-bubble layer as a cleavage plane for the rest of the one wafer to become a thin film; and heat treatment is further applied to the rest of the adhered wafers to strongly bond the wafers, thereby an SOI wafer being obtained (see JP-A No. 5-211128). And according to this method, the cleavage plane is a good mirror-polished surface and the SOI wafer 50 high in uniformity of film thickness of the SOI layer 52 can be obtained with relative ease.

In FIG. 7, further detailed description will be given of the ion implantation delamination method showing one example of a set of main steps thereof There are prepared two starting wafers, that is, a base wafer 56a serving as a support substrate 56 and a bond wafer 52a from which an SOI layer 52 is formed [FIG. 7(a), step 100]. As these wafers, for example, mirror-polished silicon single crystal wafers are used.

An oxide film 54a serving as a buried oxide film (an insulating layer) at a later step is formed on a surface of the bond wafer 52a [FIG. 7(b), step 102]. This step is carried out as follows. For execution of this step, for example, thermal oxidation is applied on the bond wafer 52a of a silicon single crystal wafer to form a silicon oxide film on the bond wafer 52a. Incidentally, the formation of the oxide film may be performed on the surface of the base wafer 56a, not on the surface of the bond wafer 52a. In the illustrated embodiment, the exemplary case where the oxide film 54a is formed on the bond wafer 52a side will be explained.

Then, hydrogen ions are implanted into the bond wafer 52a through the oxide film 54a to form a micro-bubble layer (an enclosed layer) 58 [FIG. 7(c), step 104].

Thereafter, chemical cleaning may be carried out using a $H_2SO_4$—$H_2O_2$ mixed solution or the like (step 105). The $H_2SO_4$—$H_2O_2$ mixed solution has been known in a field of wet cleaning with an abbreviation of SPM (Sulfuric acid-Hydrogen Peroxide Mixture) and is a cleaning solution for removal of organic contaminants.

Then, the bond wafer 52a in which the micro-bubble layer (the enclosed layer) 58 is formed is brought into close contact with the base wafer 56a at room temperature through the oxide film on the surface of the bond wafer 52a onto which the ion implantation has been performed [FIG. 7(d), step 106].

Then, by applying heat treatment (delaminating heat treatment) at a temperature of 500° C. or higher, a part of the bond wafer 52*a* is delaminated at the enclosed layer 58 and the rest of the bond wafer 52*a* stands in the form of a thin film [FIG. 7(*e*), step 108]. Next, by applying bonding heat treatment [FIG. 7(*f*), step 110], the wafer bond 52*a* in the form of the thin film and the base wafer 56*a* are strongly bonded with each other through oxide film 54*a* interposed therebetween, whereby a wafer 50 having an SOI structure is manufactured.

The SOI wafer 50 manufactured using the adhering method has, at this stage, a sectional structure in which the insulating film (layer) 54 and the SOI layer 52 are separately and sequentially laminated on one main surface of the support substrate 56.

Also, as shown in FIG. 6, the insulating layer 54 and the SOI layer 52 are generally smaller in diameter than the support substrate 56 by a value of the order of several mm, usually 3 mm.

Wafers made of, for example, silicon to be used as starting wafers of the SOI wafers 50 are generally manufactured by the following process. The wafer manufacturing process includes: a slicing step of slicing a single crystal rod (ingot) produced with a single crystal producing apparatus to obtain thin disk-like wafers; a chamfering step of chamfering a peripheral edge portion of the wafer obtained in the slicing step in order to prevent cracking or chipping of the wafer; a lapping step of flattening the chamfered wafer; an etching step of removing processing deformation remaining on a surface of the chamfered and lapped wafer; a primary mirror-polishing step of stock removal polishing a surface of the etched wafer by bringing a polishing cloth into contact with the surface; a final mirror-polishing step of final mirror-polishing the surface of the primary mirror-polished wafer; and a final cleaning step of cleaning a final mirror-polished wafer to remove a polishing agent or foreign matter attached to the wafer. The above-described process shows basic steps thereof, and other steps such as a donor killer heat treatment step may be added, or the same step may be repeated several times or the step sequence may be changed.

There has been a problem of reduction in device yield in manufacturing devices using SOI wafers. As a result of serious investigation into a cause for the problem, it has been considered that defects called voids are generated in an SOI layer and an oxide film, which leads to a reduction in a device yield.

Figure 4:
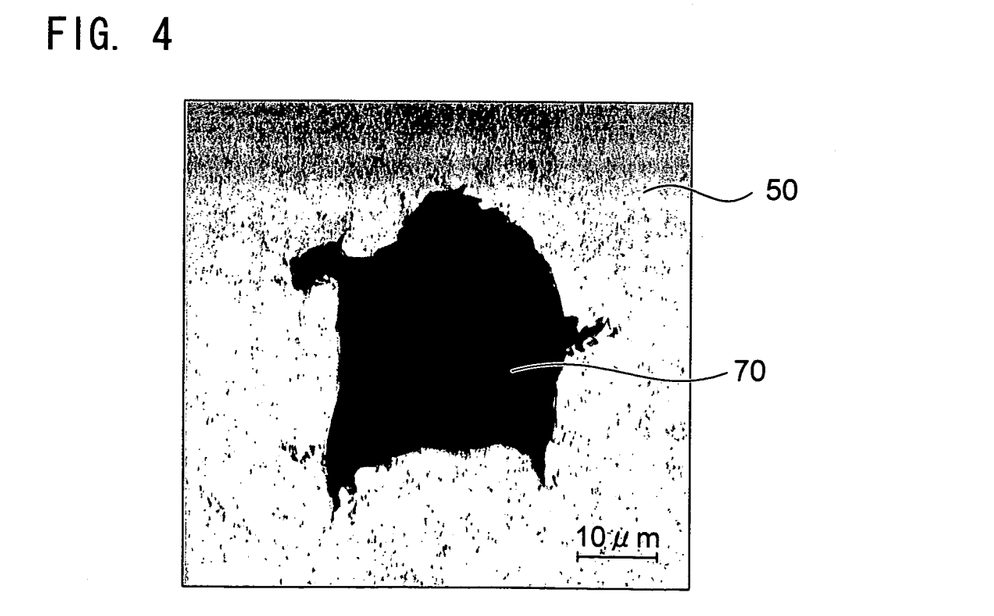
FIG. 4 is a microscopic photograph showing an example of a void on a surface of an SOI wafer observed by using a laser microscope with a confocal optical system in Experimental Example 1.

The void 70, as shown in FIG. 4, is a hole in the SOI layer or the insulating layer.

DISCLOSURE OF THE INVENTION

The present invention has been made in light of the problem described above and it is a main object of the present invention to provide a method for manufacturing an SOI wafer with high productivity in which generation of a void is suppressed in manufacturing the SOI wafer.

Serious researches on a cause for generation of a void, in order to solve the above problem, have been conducted with the result that it is made clear that a quality of a starting wafer to be used as a bond wafer of an SOI wafer has an influence on generation of a void. Especially, a line-shaped defect present on a surface of a bond wafer has been found to be problematic. Various defects have been conventionally observed on a silicon wafer serving as a starting wafer of a bond wafer, and COP is famous as a typical defect of the kinds. While COP is one kind of a pit-shaped defect, it has been clearly established that COP does not so much influence on generation of a void. The present inventors have conducted serious researches with the results that it is made clear that many kinds of other characteristic defects exist in a starting wafer and among them, a wafer portion where a line-shaped defect exists is easier to be generated as a void. The line-shaped defect is generated after a polishing step.

Figure 3:
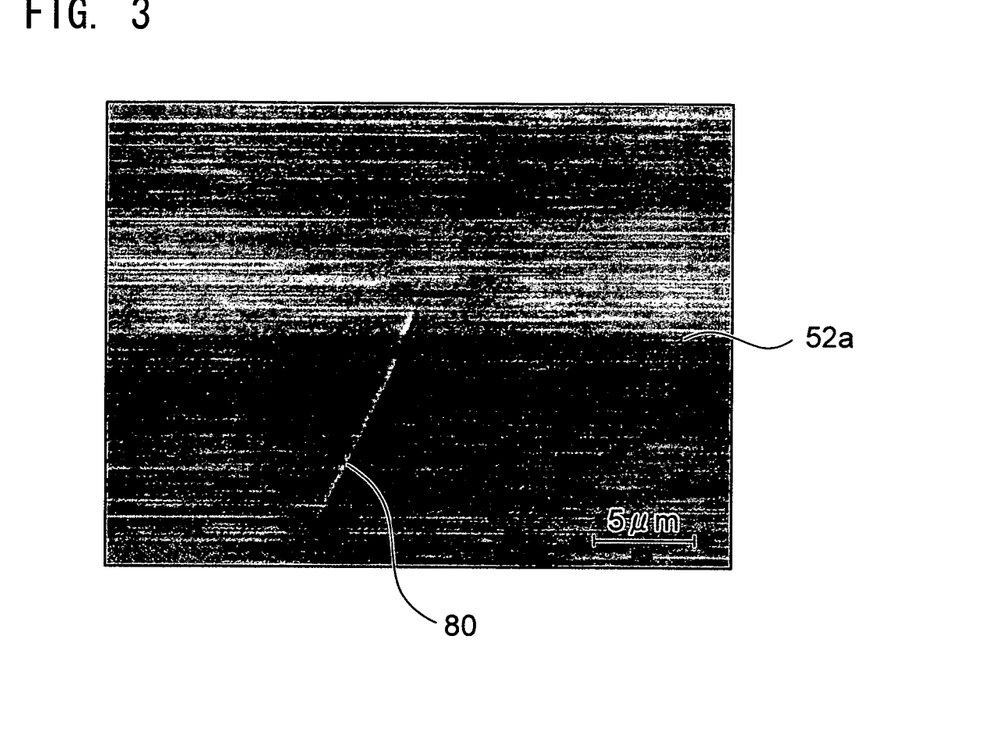
FIG. 3 is a microscopic photograph showing an example of a line defect on a surface of a bond wafer observed by using a laser microscope with a confocal optical system in Experimental Example 1.

The line defect 80 is a defect observed suitably with a laser microscope with a confocal optical system and as a feature, dissimilar to a crystal defect such as COP, has, as shown in FIG. 3, a line-shaped defect with a height of several nm and a length of about 0.5 µm or more. It is conceivable that the line defect 80 is a defect caused mainly by processing. When observing this defect with a laser microscope with a confocal optical system, an image data obtained from the defect can be observed in a state of an image pattern where a left side portion thereof is bright, a right side portion thereof is dark and micro-defects are linearly arrayed. The line defect has features in modes of the image pattern, the shape (line-shaped) and the length. A defect with the above modes can be measured even by other inspection methods, such as usual particle counter measurement. This line defect is, however, difficult in discrimination from COP, and it is difficult to detect it without observation in combination with AFM and the like, while the discrimination can be easy with a laser microscope with a confocal optical system. Incidentally, when the line defect was subjected to an analysis based on Auger electron spectroscopy, there were detected heavy metals such as Ni.

A first aspect of a method for manufacturing an SOI wafer of the present invention comprises the steps of: forming an insulating layer on at least one wafer (a bond wafer) of two starting wafers; and adhering the one wafer to the other wafer (a base wafer) without an adhesive, wherein there is used as the starting wafer a wafer having no line defect on a surface thereof.

As a result of serious researches on a cause for the line defect, it has been made clear that the defect is generated mainly in a polishing step. After the polishing step, wafers are usually subjected to final cleaning and drying, and held in a case, and thereafter, the wafers are supplied to a manufacturing process for an SOI wafer; accordingly, no change in quality of the wafers occurs after the polishing step. Therefore, if a wafer has such a line defect in the polishing step, the wafer with the line defect is used as a starting wafer for an SOI wafer. The presence of the defect leads to generation of a void with ease. Consequently, it is necessary to use as a starting wafer a wafer having no line defect or a wafer having the smallest possible number of line defects. The smaller the number of the line defects, the more preferable the quality of the starting wafer. It is most preferable that the line defect is not present at all.

Incidentally, as the method for manufacturing an SOI wafer which comprises the steps of: forming an insulating layer on at least one wafer (a bond wafer) of two starting wafers; and adhering the one wafer to the other wafer (a base wafer) without an adhesive, an insulating layer is formed on at least one wafer (a bond wafer) of the two starting wafers and the one wafer is adhered to the other wafer (a base wafer) without using an adhesive agent, it is preferable to adopt a manufacturing method for an adhered SOI wafer manufacturing an SOI wafer which comprises the steps of forming an insulating layer on at least one wafer of the two starting wafers; implanting hydrogen ions or rare gas ions through the upper surface of the one wafer (the bond wafer) to form a micro-bubble layer in the interior of the one wafer; thereafter bringing the surface of the one wafer through which the ions have been implanted into close contact with the other wafer (the base wafer) through the insulating layer interposed therebetween; then delaminating a part of the one wafer with the micro-bubble layer as a cleavage plane by applying heat treatment for the rest thereof to become a thin film; and bonding strongly the one wafer in the form of a thin film to the other wafer through the insulating layer interposed therebetween by applying further heat treatment.

Figure 5:
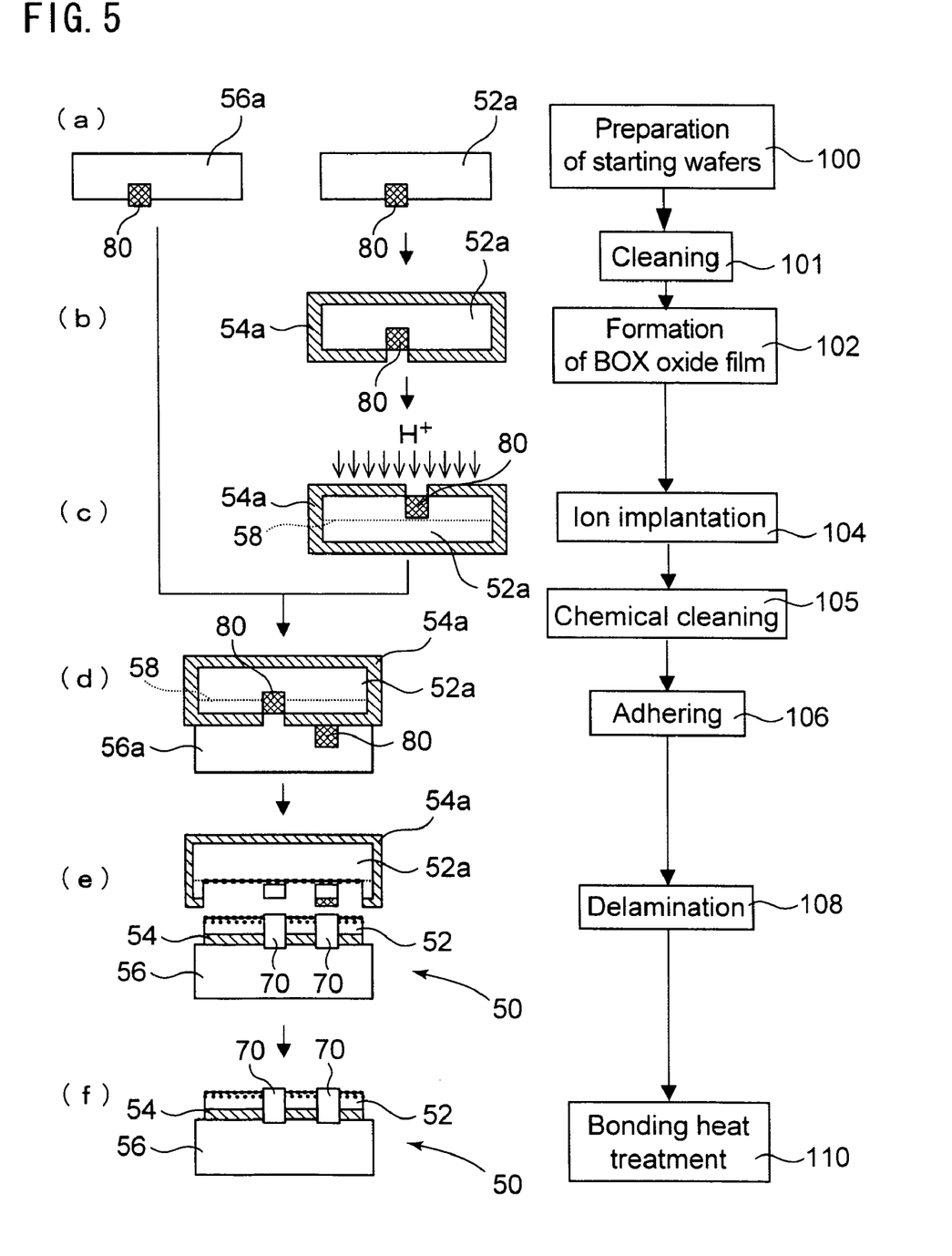
FIG. 5, consisting of FIGS. 5(a) to 5(f), is a flowchart showing an order of steps in a manufacturing process for an SOI wafer together with schematic views in Experimental Example 1.

As a cause for generation of a void, it is considered that, as shown in FIG. 5, in a case where a comparatively large line defect 80 exists on the base wafer 56a and/or the bond wafer 52a (FIG. 5(a)), formation of an oxide film 54a on the bond wafer 52a deteriorates characteristics of the oxide film 54a or makes worse flatness (uniformity) of the oxide film 54a itself (FIGS. 5(b) and (c)), and the bond wafer 52a in the state is adhered to the base wafer 56a (FIG. 5(d)), adherence of the oxide film 54a in a portion where the line defect exists is weak, which results in a void 70 (FIGS. 5(e) and (f)). Therefore, the line defect 80 is an especially influential defect in an SOI wafer manufacturing method using a bonding method (adhering method). Especially, in a method in which hydrogen ions are, as described above, implanted onto one wafer of two starting wafers to form the micro-bubble layer 58 in the one wafer and thereafter, the wafers are subjected to adherence and delamination, generation of a void is conspicuous, which exerts a great effect in manufacturing an SOI wafer using wafers without such a defect as the starting wafers. This method is further preferable since it is used especially for manufacturing a high quality, thin film SOI wafer.

As the starting wafers, it is preferable that neither the base wafer nor the bond wafer has such a line defect, while it is more preferably that a wafer on which an oxide film is formed has no line defect.

It is also possible to reduce the line defect by suitably adjusting polishing conditions such as a polishing agent to be used in a polishing step. Accordingly, in order to use a wafer having no defect as a starting wafer of the SOI wafer, a surface of the starting wafer is inspected for a line defect so that a line defect free wafer may be sorted for use. Since a generation frequency of line defects is different according to a polishing condition or the like, a wafer is subjected to inspection by using a laser microscope with a confocal optical system in each polishing step so that a line defect free wafer is preferably sorted and used for manufacturing the SOI wafer.

In order to positively obtain a line defect free wafer, it is can be achieved, for example, by applying high temperature heat treatment. Therefore, a second aspect of a manufacturing method for an SOI wafer of the present invention is directed to a method for manufacturing an SOI wafer which comprises the steps of: forming an insulating layer on at least one wafer of the two starting wafers; and adhering the one wafer to the other wafer without an adhesive, wherein the starting wafer is subjected to high temperature heat treatment in advance.

As conditions for the high temperature heat treatment, wafers are heat treated at a high temperature of 1100° C. or higher. The temperature is especially preferably in the range of 1100° C. to 1350° C. If the temperature is at 1000° C., there is a case where a line defect is not sufficiently annihilated, while the temperature is 1100° C. or higher, a line defect can be stably annihilated. The upper limit of the temperature is not specifically limited and a temperature of the melting point or lower can be adopted, whereas a temperature closer to the melting point causes easily other problems including generation of many slips; therefore, treatment at a temperature of 1350° C. or lower is preferable. A heat treatment time may be properly set depending on a state of generation of line defects and the time is sufficiently 10 min. or longer, while as long as 40 hrs. at the longest is sufficient for the heat treatment time from the viewpoint of productivity. If the temperature is at 1200° C., the heat treatment time is usually sufficiently on the order of 1 hr. As an atmosphere gas, while a nitrogen atmosphere can be used, it is preferable to use an argon atmosphere or a hydrogen atmosphere. A line defect can be easily annihilated by application of such high temperature heat treatment.

With the method described above, no line defect can be generated to reduce generation of voids, thereby the SOI wafer being manufactured with a good yield.

BEST MODE FOR CARRYING OUT THE INVENTION

Embodiments of the present invention will be described with reference to the accompanying drawings. It is needless to say that the embodiments shown in the drawings are exemplified, and various modifications can be effected without departing from the technical concept of the present invention.

Figure 1:
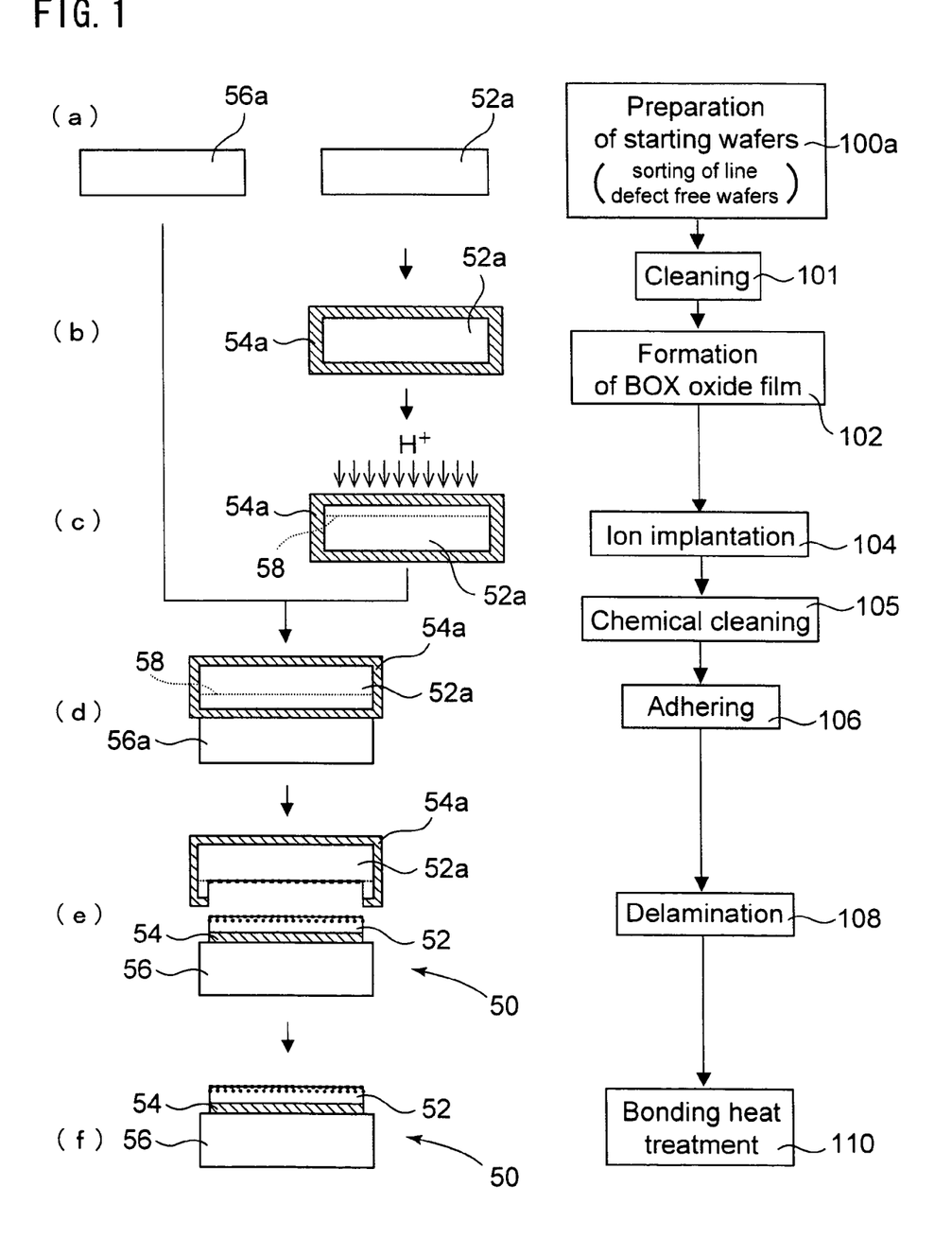
FIG. 1, consisting of FIGS. 1(a) to 1(f), is a flowchart showing an example of an order of steps in a first aspect of a method for manufacturing an SOI wafer of the present invention together with schematic views.
Figure 2:
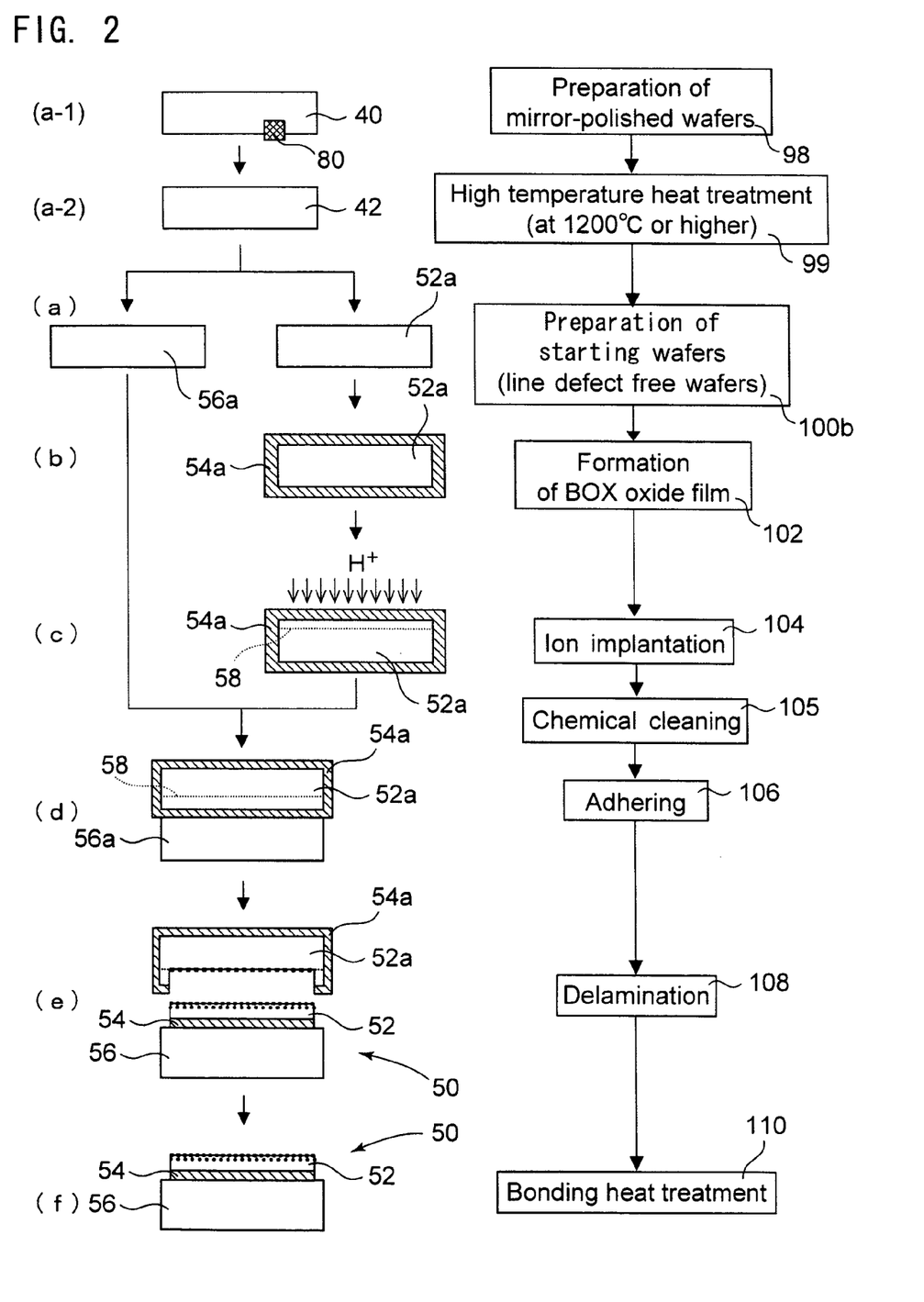
FIG. 2, consisting of FIGS. 2(a), including 2(a-1) and 2(a-2). to 2(f), is a flowchart showing an example of an order of steps in a second aspect of a method for manufacturing an SOI wafer of the present invention together with schematic views.

FIG. 1 is a flowchart showing an example of an order of steps in a first aspect of a method for manufacturing an SOI wafer of the present invention together with schematic views. FIG. 2 is a flowchart showing an example of an order of steps in a second aspect of a method for manufacturing an SOI wafer of the present invention together with schematic views. In the present invention, in the conventional manufacturing process for an SOI wafer shown in FIG. 7 described before, there are controlled line defects on wafers serving as starting wafers of a bond wafer and a base wafer to be used for adhering, with the result that adhering is carried out with wafers having no line defect.

In order to form an SOI structure, as in the conventional process shown in FIG. 7, first of all, there are prepared as starting wafers a base wafer 56a serving as a support substrate 56 and a bond wafer 52a [FIG. 1(a), step 100a and FIG. 2(a), step 100b]. The wafers are all mirror-polished silicon single crystal wafers as described above. Especially, in the present invention, line defect free wafers are used as the starting wafers to manufacture the SOI wafer.

Line defect free starting wafers are sorted for use, for example, as shown in FIG. 1(a), by inspecting a line defect on a surface of each of wafers serving as a starting wafer of the SOI wafer using a laser microscope with a confocal optical system.

Here, it is preferable to use mirror-polished wafers that are subjected to high temperature heat treatment in advance as in the structure of the second aspect of the present invention. Description will be given using FIG. 2, in which a wafer 40 obtained in a mirror-polishing step is prepared [FIG. 2(a-1), step 98]. There is a case where a line defect 80 has been generated on the mirror-polished wafer 40. A high temperature treatment is applied to the mirror-polished 40 [FIG. 2(2-2), step 99]. The high temperature treatment is carried out at 1100° C. or higher. It is difficult to annihilate a line defect sufficiently in heat treatment at a temperature of the order of 1000° C. Heat treatment at 1200° C. for 1 hr or longer is preferably adopted. Though no specific limitation is placed on an atmosphere gas, it is preferable to treat a wafer in an argon atmosphere or a hydrogen atmosphere. With such high temperature heat treatment applied, line defects 80 can be easily reduced.

With such heat treatment applied, even if a line defect 80 has been generated on the wafer surface after polishing, the line defect 80 on a wafer surface is annihilated, thereby a starting wafer 42 having no line defect 80 on its surface being obtained [FIG. 2(a-2)]. Then, it is confirmed that there is no line defect 80 on the bond wafer 52a and the base wafer 56a using a laser microscope with a confocal optical system.

Incidentally, the above process is shown as a preferred example and in a case where high temperature heat treatment is carried out, it is not necessarily required to inspect the line defect using a laser microscope with a confocal optical system. By applying high temperature heat treatment, even if a line defect is generated in a polishing step, the line defect can be annihilated, with the result that starting wafers having almost no line defect can be prepared.

Likewise, if by contriving a polishing method or the like, line defect free wafers are manufactured, the wafers can be used as they are, and if wafers are manufactured through a polishing step where a generation frequency of line defects is low, the wafers are inspected using a laser microscope with a confocal optical system to sort line defect free wafers among them (without applying high temperature heat treatment or the like after the sorting) and thus sorted line defect free wafers may be used as starting wafers of SOI wafers.

With the starting wafers described above, it is enough to follow the conventional method for manufacturing an SOI wafer. That is, in order to manufacture an SOI wafer, an oxide film serving as a buried oxide film (an insulating layer) is formed on a surface of the bond wafer [FIG. 1(b), FIG. 2(b), step 102]. In this step, a silicon oxide film 54a is formed, for example, by thermal oxidation. Incidentally, the formation of the oxide film may be performed on the surface of the base wafer 56a, not on the surface of the bond wafer 52a. In the illustrated embodiment, the exemplary case where the oxide film 54a is formed on the bond wafer 52a side will be explained.

Then, hydrogen ions are implanted into the bond wafer 52a through the oxide film 54a to form a micro-bubble layer (an enclosed layer) 58 [FIG. 1(c), FIG.2(c), step 104].

Thereafter, a chemical cleaning is carried out (step 105). The chemical cleaning may be implemented using RCA, a $H_2SO_4$—$H_2O_2$ mixed solution or the like, which have been conventionally known. The $H_2SO_4$—$H_2O_2$ mixed solution has been known in a field of wet cleaning with an abbreviation of SPM and is a cleaning solution to be used for removal of organic contaminants.

Then, the bond wafer 52a in which the micro-bubble layer (the enclosed layer) 58 is formed is brought into close contact with the base wafer 56a at room temperature through the oxide film on the bond wafer 52a onto which the ion implantation has been performed [FIG. 1(d), step 106].

Then, by applying heat treatment (delaminating heat treatment) at a temperature of 500° C. or higher, a part of the bond wafer 52a is delaminated at the enclosed layer 58 and the rest of the bond wafer 52a stands in the form of a thin film [FIG. 1(e), FIG. 2(e), step 108]. Next, by applying bonding heat treatment [FIG. 1(f), FIG. 2(f), step 110], the wafer bond 52a in the form of the thin film and the base wafer 56a are strongly bonded with each other through oxide film 54a interposed therebetween, whereby a wafer 50 having an SOI structure is manufactured.

As shown in FIGS. 1(f) and 2(f), the SOI wafer 50 manufactured using the adhering method has, at this stage, a sectional structure in which the insulating film (layer) 54 and the SOI layer 52 are separately and sequentially laminated on one main surface of the support substrate 56. Also, there are present regions called polishing sags on the outer peripheral portions of surfaces of the two mirror polished wafers to be adhered to each other, and bonding at the regions is insufficient; therefore, the regions are removed, with the result that as shown in FIG. 6, the insulating layer 54 and the SOI layer 52 are generally smaller in diameter than the support substrate 56 by a value of the order of several mm.

In addition, another step may be adopted, in which a surface of the SOI layer 52 of the wafer having the SOI structure is modified and the thickness of the SOI layer 52 is controlled. For example, since damage caused by hydrogen ion implantation remains on a surface (a delaminating plane) of the SOI layer 52 of the SOI wafer 50 having the obtained SOI structure, the damage layer is removed by applying polishing with a small polishing stock removal usually called touch polishing. In replacement of touch polishing, by performing heat treatment in an argon gas atmosphere, sacrifice oxidation treatment in which thermal oxidation and removal of an oxide film are conducted to reduce the film thickness of the SOI layer 52 or a combination thereof in a proper way, an SOI wafer 50 having a damage free thin film SOI layer 52 may be manufactured.

EXAMPLES

While further concrete description will be given of the present invention, showing examples below, it is needless to say that the examples are presented by way of illustration and should not be construed by way of limitation.

Experimental Example 1

Description will be given of a conventional method for an SOI wafer below with reference to FIGS. 3 to 5 while schematically showing an influence of a line defect. At first, as a base wafer 56a and a bond wafer 52a, there were prepared p-type mirror-polished silicon wafers each having a diameter of 300 mm, a <100> orientation and a resistivity of 10 Ω·cm manufactured from an ingot grown by a CZ method [FIG. 5(a), step 100]. The starting wafers were wafers on a surface of each of which about 100 line defects were observed. The sizes of the line defects each were 0.5 μm or more in diameter. The line defects were, as shown in FIG. 3, usually observed as a size of the order in the range of from 2 to 3 μm.

Observation of a line defect was conducted using a laser microscope with a confocal optical system. The laser microscope with a confocal optical system is one manufactured by Lasertech Co. with a trade name of MAGICS.

With the wafers described above, there was formed an oxide film 54a with a film thickness of 150 nm on a surface of the bond wafer 52a by thermal oxidation [FIG. 5(b), step 102]. Then, hydrogen ions were implanted onto the surface of the bond wafer to form an enclosed layer 58 [FIG. 5(c), step 104]. Then, SPM cleaning was applied (step 105).

Then, the surface of the bond wafer 52a onto which hydrogen ions and the base wafer 56a were brought into close contact with each other [FIG. 5(d), step 106]. Then, delaminating heat treatment was applied thereto at 500° C. for 30 min. in a nitrogen atmosphere to delaminate a part of the bond wafer 52a to thereby make the bond wafer into a thin film, with the result that there was obtained an SOI layer having a thickness of about 250 nm [FIG. 5(e), step 108].

Thereafter, bonding heat treatment was applied thereto at 1100° C. for 2 hrs in a nitrogen atmosphere to strongly bond the SOI layer to the base wafer. As a result, there was manufactured a wafer 50 having an SOI structure [FIG. 5(f), step 110].

Then, in order to remove surface roughness and damage of the SOI layer 52, heat treatment was applied to the wafer 50 in an argon gas atmosphere. This was carried out with a vertical heater heating type heat treatment apparatus (a batch furnace) at 1200° C. for 1 hr in an argon atmosphere. With such heat treatment applied, damage created by ion implantation and surface roughness of the SOI layer were improved to some extent. Next, in order to improve a surface quality of the SOI layer 52, the SOI layer 52 was polished with a CMP apparatus and then the SOI layer 52 was sacrifice oxidized, that is silicon in the SOI layer 52 was oxidized to form an oxide film and the oxide film was treated with hydrofluoric acid, with the result that there was finally manufactured the SOI wafer 50 with the SOI layer 52 of about 150 nm in thickness.

After the SOI wafer 50 was manufactured in such a way as described above, a position where the line defect 80 was observed was again observed. As a result thereof, there was observed a void 70 of 5 μm or more across as shown in FIG. 4 in the portion where the line defect 80 had existed. Voids 70 were totally observed at about 200 pieces per wafer. As schematically shown in FIG. 5, the oxide film 54a on the portion where a line defect 80 has existed is weak in adherence, which is considered to lead to the void 70.

Example 1

An SOI wafer 50 was manufactured according to a manufacturing process of a method of the present invention shown in FIG. 2. At first, there were prepared p-type mirror-polished silicon wafers each having a diameter of 200 mm, a <100> orientation and a resistivity of 10 Ω·cm manufactured from an ingot grown by a CZ method [FIG. 2(a-1), step 98].

The starting wafers were first subjected to high temperature heat treatment [FIG. 2(a-2), step 99]. The high temperature heat treatment was carried out with a vertical heater heating type heat treatment apparatus (a batch furnace) in a 100% argon atmosphere at 1200° C. for 1 hr. In the heat treatment, a temperature rise rate up to 1000° C. was 5° C./min. and thereafter the rate up to 1200° C. was 2° C./min., while a temperature fall rate was 2° C./min.

Each of the wafer surfaces was inspected on a line defect using a laser microscope with a confocal optical system and absence of a line defect was confirmed on all the wafers. The line defect free wafers were used as a base wafer 56a and a bond wafer 52a [FIG. 2(a), step 100].

There was formed an oxide film 54a with a film thickness of 150 nm on a surface of the bond wafer 52a by thermal oxidation [FIG. 2(b), step 102]. Then, hydrogen ions were implanted onto the surface of the bond wafer to form an enclosed layer 58 [FIG. 2(c), step 104]. Then, SPM cleaning was applied as a chemical cleaning (step 105).

Then, the surface of the bond wafer 52a onto which hydrogen ions and the base wafer 56a were brought into close contact with each other [FIG. 2(d), step 106]. Then, delaminating heat treatment was applied thereto at 500° C. for 30 min. in a nitrogen atmosphere to delaminate a part of the bond wafer 52a to thereby make the bond wafer into a thin film, with the result that there was obtained an SOI layer having a thickness of about 250 nm [FIG. 2(e), step 108]. Thereafter, bonding heat treatment was applied thereto at 1100° C. for 2 hrs in a nitrogen atmosphere to strongly bond the SOI layer to the base wafer. As a result, there was manufactured a wafer 50 having an SOI structure [FIG. 2(f), step 110].

Then, after forming the SOI structure, in order to remove surface roughness and damage of the SOI layer 52, heat treatment is applied to the wafer 50 in an argon gas atmosphere. This was carried out with a vertical heater heating type heat treatment apparatus (a batch furnace) at 1200° C. for 1 hr in an argon atmosphere. With such heat treatment applied, damage created by ion implantation and surface roughness of the SOI layer were improved to some extent. Next, in order to improve a surface quality of the SOI layer 52, the SOI layer 52 was polished with a CMP apparatus and then the SOI layer 52 was sacrifice oxidized, with the result that there was finally manufactured the SOI wafer 50 with the SOI layer 52 of about 150 nm in thickness.

Voids on the obtained SOI wafer 50 were observed. As a result, about 80 voids were observed. Voids are conceivably caused by a factor other than line defects and generation of a void was not perfectly suppressed, whereas it was revealed that if line defect free wafers are used, a generation frequency of voids can be greatly reduced as compared with a case where wafers with line defects are used. A product yield increases in manufacture of devices using such SOI wafers.

The present invention is not limited to the above embodiments. The embodiments are presented by way of illustration only and any of modifications or alterations thereof are included in the technical scope of the present invention as far as those have substantially the same structure as the technical concept stated in the appended claims of the present invention and exert an action and effect similar to those of the present invention.

For example, the manufacturing processes described in the above examples are presented by way of illustration only. As far as the method for manufacturing an SOI wafer includes the adhering step, the present invention may employ addition of various steps such as cleaning and heat treatment other than the above steps. Also, the present invention may adopt proper changes of the steps depending on purposes, for example, a partial change for the order of the steps, and partial omission for the steps such as polishing. Especially, no specific limitation is placed on a step of controlling a thickness of an SOI layer.

CAPABILITY OF EXPLOITATION IN INDUSTRY

As described above, according to the present invention, since an SOI wafer is manufactured using line defect free wafers, the generation number of voids remarkably decreases, and it is possible to manufacture an SOI wafer with a good product yield and high productivity.

The invention claimed is:

1. A method for manufacturing an SOI wafer comprising the steps of:
   providing two starting wafers with each starting wafer having at least one line-defect-free surface;
   forming an insulating layer on the line-defect-free surface on at least one wafer of two starting wafers; and
   adhering the one wafer to the other wafer without an adhesive with the line-defect-free surfaces facing each other, wherein the starting wafer is subjected to a high temperature heat treatment in advance and wherein the high temperature is carried out at a high temperature of 1100° C. or higher for at least one hour.

2. The method for manufacturing an SOI wafer according to claim 1, wherein the method comprises the steps of:
   forming an insulating layer on at least one wafer of the two starting wafers;
   implanting hydrogen ions or rare gas ions through the upper surface of the one wafer to form a micro-bubble layer in the interior of the one wafer; thereafter
   bringing the surface of the one wafer through which the ions have been implanted into close contact with the other wafer through the insulating layer interposed therebetween; then
   delaminating a part of the one wafer with the micro-bubble layer as a cleavage plane by applying heat treatment for the rest thereof to become a thin film; and
   bonding strongly the one wafer in the form of a thin film to the other wafer through the insulating layer interposed therebetween by applying further heat treatment.

3. The method for manufacturing an SOI wafer according to claim 1, wherein surfaces of wafers each to be used as the starting wafer of the SOI wafer are inspected with respect of a line defect to sort line defect free wafers for use.

4. The method for manufacturing an SOI wafer according to claim 3, wherein the inspection of the line defect is carried out with a laser microscope with a confocal optical system.

* * * * *